United States Patent
Torimi et al.

(10) Patent No.: US 10,358,741 B2
(45) Date of Patent: *Jul. 23, 2019

(54) SEED MATERIAL FOR LIQUID PHASE EPITAXIAL GROWTH OF MONOCRYSTALLINE SILICON CARBIDE, AND METHOD FOR LIQUID PHASE EPITAXIAL GROWTH OF MONOCRYSTALLINE SILICON CARBIDE

(75) Inventors: Satoshi Torimi, Kanonji (JP); Satoru Nogami, Kanonji (JP); Tsuyoshi Matsumoto, Kanonji (JP)

(73) Assignee: TOYO TANSO CO., LTD., Osaka (JP)

( * ) Notice: Subject to any disclaimer, the term of this patent is extended or adjusted under 35 U.S.C. 154(b) by 678 days.

This patent is subject to a terminal disclaimer.

(21) Appl. No.: 13/996,077

(22) PCT Filed: Jun. 29, 2011

(86) PCT No.: PCT/JP2011/064876
§ 371 (c)(1),
(2), (4) Date: Jun. 20, 2013

(87) PCT Pub. No.: WO2012/086238
PCT Pub. Date: Jun. 28, 2012

(65) Prior Publication Data
US 2013/0269597 A1  Oct. 17, 2013

(30) Foreign Application Priority Data

Dec. 24, 2010 (JP) ................ 2010-288467
Dec. 24, 2010 (JP) ................ 2010-288470
(Continued)

(51) Int. Cl.
*C30B 19/12* (2006.01)
*C30B 29/36* (2006.01)
*C30B 28/14* (2006.01)

(52) U.S. Cl.
CPC .............. *C30B 19/12* (2013.01); *C30B 28/14* (2013.01); *C30B 29/36* (2013.01); *Y10T 428/26* (2015.01)

(58) Field of Classification Search
CPC ......... C30B 19/00; C30B 19/08; C30B 19/10; C30B 19/12; C30B 28/00; C30B 28/04; C30B 29/00; C30B 29/36
(Continued)

(56) References Cited

U.S. PATENT DOCUMENTS 5,879,450 A  3/1999  Lee et al.
6,214,108 B1  4/2001  Okamoto et al.
(Continued)

FOREIGN PATENT DOCUMENTS

JP  55-144499 A  11/1980
JP  04-055397 A  2/1992
(Continued)

OTHER PUBLICATIONS

S. Rohmfeld, et al. publication entitled "Influence of stacking disorder on the Raman spectrum of 3C—SiC," Phys. Stat. Sol. (b), vol. 215, pp. 115-19 (1999).*
(Continued)

*Primary Examiner* — Kenneth A Bratland, Jr.
(74) *Attorney, Agent, or Firm* — Keating and Bennett, LLP

(57) ABSTRACT

Provided is an inexpensive seed material for liquid phase epitaxial growth of silicon carbide. A seed material 12 for liquid phase epitaxial growth of a monocrystalline silicon carbide includes a surface layer containing a polycrystalline silicon carbide with a 3C crystal polymorph. Upon X-ray diffraction of the surface layer thereof, a first-order diffraction peak corresponding to a (111) crystal plane is observed as a diffraction peak corresponding to the polycrystalline
(Continued)

silicon carbide with a 3C crystal polymorph but no other first-order diffraction peak having a diffraction intensity of 10% or more of the diffraction intensity of the first-order diffraction peak corresponding to the (111) crystal plane is observed.

8 Claims, 9 Drawing Sheets

(30) Foreign Application Priority Data

Dec. 24, 2010 (JP) .................................. 2010-288473
Dec. 24, 2010 (JP) .................................. 2010-288477

(58) Field of Classification Search
USPC ................ 117/11, 54, 58, 63, 902, 937, 951
See application file for complete search history.

(56) References Cited

U.S. PATENT DOCUMENTS

| | | | | |
|---|---|---|---|---|
| 6,936,102 | B1* | 8/2005 | Otsuki | .................. C23C 16/325 |
| | | | | 117/101 |
| 2006/0011131 | A1 | 1/2006 | Otsuki et al. | |
| 2006/0249073 | A1* | 11/2006 | Asaoka | .................. C30B 19/00 |
| | | | | 117/84 |
| 2013/0263774 | A1* | 10/2013 | Torimi | .................... C30B 19/12 |
| | | | | 117/63 |
| 2013/0269596 | A1* | 10/2013 | Torimi | .................... C30B 19/00 |
| | | | | 117/63 |
| 2013/0285060 | A1* | 10/2013 | Torimi | .................... C30B 19/00 |
| | | | | 257/51 |

FOREIGN PATENT DOCUMENTS

| | | |
|---|---|---|
| JP | 10-324599 A | 12/1998 |
| JP | 2000-044398 A | 2/2000 |
| JP | 2000-160343 A | 6/2000 |
| JP | 2001-107239 A | 4/2001 |
| JP | 2005-097040 A | 4/2005 |
| JP | 2008-37684 A | 2/2008 |
| JP | 2008-230946 A | 10/2008 |

OTHER PUBLICATIONS

Y. Chinone, et al. publication entitled, "Applications of high purity SiC prepared by chemical vapor deposition," Springer Proceedings in Physics, vol. 43, Jan. 1, 1989, pp. 198-206.*
S. Rohmfeld, et al. publication entitled "Influence of stacking disorder on the Raman spectrum of 3C—SiC," Phys. Stat. Sol. (b) vol. 215, pp. 115-119 (1999).*
V.C. George, et al. publication entitled "Bias enhanced deposition of highly oriented b-SiC thin films ucing low pressure hot filament chemical vapor deposition technique," Thin Solid Films, vol. 419, pp. 114-117 (2002).*
Y. Chinone, et al. publication entitled, "Applications of high purity SiC prepared by chemical vapor deposition," Springer Proceedings in Physics, vol. 43, Jan. 1, 1989, pp. 198-206. (Year: 1989).*
S. Rohmfeld, et al. publication entitled "Influence of stacking disorder on the Raman spectrum of 3C—SiC," Phys. Stat. Sol. (b) vol. 215, pp. 115-119 (1999). (Year: 1999).*
V.C. George, et al. publication entitled "Bias enhanced deposition of highly oriented b-SiC thin films ucing low pressure hot filament chemical vapor deposition technique," Thin Solid Films, vol. 419, pp. 114-117 (2002). (Year: 2002).*
Official Communication issued in corresponding European Patent Application No. 11850722.7, dated Apr. 3, 2014.
Chinone et al., "Applications of High Purity SiC Prepared by Chemical Vapor Deposition," Springer Proceedings in Physics, vol. 43, Jan. 1, 1989, pp. 198-206.
George et al., "Bias Enhanced Deposition of Highly Oriented β-SiC Thin Films Using Low Pressure Hot Filament Chemical Vapour Deposition Technique," Thin Solid Films, vol. 419, Nov. 1, 2002, pp. 114-117.
Official Communication issued in International Patent Application No. PCT/JP2011/064876, dated Aug. 16, 2011.
Nishitani et al., "Metastable solvent epitaxy of SiC", Journal of Crystal Growth, vol. 310, 2008, pp. 1815-1818.
Steckl et al., "Characterization of 3C—SiC crystals grown by thermal decomposition of methyltrichlorosilane", Applied Physics Letters, vol. 69, No. 25, Dec. 16, 1996, pp. 3824-3826.
English translation of Official Communication issued in corresponding International Application PCT/JP2011/064876, dated Jul. 11, 2013.
Official Communication issued in European Patent Application No. 11 850 722.7, dated May 29, 2017.

* cited by examiner

SEED MATERIAL FOR LIQUID PHASE EPITAXIAL GROWTH OF MONOCRYSTALLINE SILICON CARBIDE, AND METHOD FOR LIQUID PHASE EPITAXIAL GROWTH OF MONOCRYSTALLINE SILICON CARBIDE

TECHNICAL FIELD

This invention relates to a seed material for liquid phase epitaxial growth of a monocrystalline silicon carbide and a method for liquid phase epitaxial growth of a monocrystalline silicon carbide using the same.

BACKGROUND ART

Silicon carbide (SiC) is considered to be capable of achieving high-temperature resistance, high voltage resistance, high-frequency resistance, and high environment resistance each of which could not be achieved by conventional semiconductor materials, such as silicon (Si) and gallium arsenide (GaAs). Therefore, silicon carbide is expected as a semiconductor material for next-generation power devices and a semiconductor material for high-frequency devices.

The seeded sublimation growth method (modified Lely method) is conventionally proposed as a method for growing a monocrystalline silicon carbide, such as for example in Patent Literature 1 below. In this modified Lely method, a seed material made of a monocrystalline silicon carbide is placed in a low-temperature zone of a crucible and a powder of source material containing Si as a source material is placed in a high-temperature zone thereof. Then, the interior of the crucible is brought into an inert atmosphere and heated to a high temperature of 1450° C. to 2400° C. to sublimate the powder of source material placed in the high-temperature zone. As a result, silicon carbide can be epitaxially grown on the surface of the seed material placed in the low-temperature zone.

Nevertheless, the modified Lely method is a method of growing silicon carbide crystals by providing a temperature gradient in the gas phase. Therefore, in the case of using the modified Lely method, a large apparatus is required for epitaxial growth of silicon carbide and the process for epitaxial growth of silicon carbide is difficult to control. This presents a problem of rise in cost of producing a silicon carbide epitaxial growth film. In addition, epitaxial growth of silicon carbide in the gas phase is nonequilibrium. Therefore, crystal defects are likely to occur in the silicon carbide epitaxial growth film being formed and there also arises a problem of ease of roughening of the crystal structure.

An example of a method for epitaxial growth of silicon carbide other than the modified Lely method is metastable solvent epitaxy (MSE) which is a method of epitaxially growing silicon carbide in the liquid phase, as proposed for example in Patent Literature 2.

In MSE, a seed material made of a crystalline silicon carbide, such as a monocrystalline silicon carbide or a polycrystalline silicon carbide, and a feed material made of silicon carbide are faced each other at a distance as small as, for example, 100 μm or less and a Si melt layer is interposed between them. Then, these materials are subjected to heating treatment in a vacuum, high-temperature environment to epitaxially grow silicon carbide on the surface of the seed material.

It is considered that in MSE a difference in chemical potential between the seed material and the feed material causes a concentration gradient of carbon dissolved in the Si melt layer and thus a silicon carbide epitaxial growth film is formed. Therefore, unlike the case of using the modified Lely method, there is not necessarily a need to provide a temperature difference between the seed material and the feed material. Hence, with the use of MSE, not only the process for epitaxial growth of silicon carbide can be easily controlled with a simple apparatus but also a high-quality silicon carbide epitaxial growth film can be stably formed.

In addition, MSE also has the advantage of being capable of forming a silicon carbide epitaxial growth film even on a large-area seed substrate and the advantage of lowering the temperature for the process of epitaxially growing silicon carbide because the extremely small thickness of the Si melt layer facilitates the diffusion of carbon from the feed material.

Accordingly, MSE is considered to be an extremely useful method as the method for epitaxial growth of a monocrystalline silicon carbide and active research on MSE has been carried out.

CITATION LIST

Patent Literature

Patent Literature 1: JP-A-2005-97040
Patent Literature 2: JP-A-2008-230946

SUMMARY OF INVENTION

Technical Problem

As described above, it is considered that in MSE the feed material and the seed material should be selected so that the feed material has a higher free energy than the seed material. Therefore, for example, Patent Literature 2 above describes that a feed substrate and a seed substrate are made different from each other in free energy by making the feed substrate and the seed substrate different in crystal polymorph. More specifically, the literature describes that if the feed substrate is formed of a polycrystalline 3C—SiC substrate, the seed substrate is formed such as of a monocrystalline 4H—SiC substrate having a lower free energy than the 3C—SiC substrate.

In this relation, a polycrystalline 3C—SiC substrate can be easily produced by CVD. Therefore, as described in Patent Literature 2, the use of a 3C—SiC substrate as the feed substrate enables a low cost of formation of a silicon carbide epitaxial growth film.

However, among silicon carbide substrates including a 4H—SiC substrate and a 3C—SiC substrate, the 3C—SiC substrate has the highest free energy. Therefore, it has been considered that the 3C—SiC substrate cannot be used as the seed substrate required to have low free energy. For this reason, in Patent Literature 2, the monocrystalline 4H—SiC substrate, which is difficult and expensive to produce, is used as the seed substrate. This presents a problem of rise in cost of forming a silicon carbide epitaxial growth film.

The present invention has been made in view of the foregoing points and an object thereof is to provide an inexpensive seed material for liquid phase epitaxial growth of silicon carbide.

Solution to Problem

The inventors have found through intensive studies that, among polycrystalline silicon carbide materials with a 3C crystal polymorph, there are materials likely to be eluted into a silicon melt layer and materials less likely to be eluted into a silicon melt layer and that the materials less likely to be eluted into a silicon melt layer can be suitably used as the seed material for liquid phase epitaxial growth of silicon carbide. As a result, the inventors have led to the accomplishment of the invention.

Specifically, a seed material for liquid phase epitaxial growth of a monocrystalline silicon carbide according to the present invention is a seed material used in a method for liquid phase epitaxial growth of a monocrystalline silicon carbide. The seed material for liquid phase epitaxial growth of a monocrystalline silicon carbide according to the present invention includes a surface layer containing a polycrystalline silicon carbide with a 3C crystal polymorph.

Upon X-ray diffraction of the surface layer thereof, a first-order diffraction peak corresponding to a (111) crystal plane is observed as a diffraction peak corresponding to the polycrystalline silicon carbide with a 3C crystal polymorph but no other first-order diffraction peak having a diffraction intensity of 10% or more of the diffraction intensity of the first-order diffraction peak corresponding to the (111) crystal plane is observed. Therefore, the seed material for liquid phase epitaxial growth of a monocrystalline silicon carbide according to the present invention is less likely to cause elution into the silicon melt layer. Thus, with the use of the seed material for liquid phase epitaxial growth of a monocrystalline silicon carbide according to the present invention, a concentration gradient in the silicon melt layer can be suitably formed, so that liquid phase epitaxial growth of silicon carbide can be suitably performed. The reason why the elution into the silicon melt layer becomes less likely to occur when no other first-order diffraction peak having a diffraction intensity of 10% or more of the diffraction intensity of the first-order diffraction peak corresponding to the (111) crystal plane is observed can be that the (111) crystal plane is a crystal plane less likely to be eluted into the silicon melt layer than the other crystal planes.

Furthermore, the surface layer of the seed material for liquid phase epitaxial growth of a monocrystalline silicon carbide according to the present invention contains a polycrystalline silicon carbide with a 3C crystal polymorph. Therefore, unlike the case where the surface layer contains a polycrystalline silicon carbide with a 4H or 6H crystal polymorph and the case where the surface layer is made of a monocrystalline silicon carbide, the surface layer can be formed with ease at low cost by CVD (chemical vapor deposition).

Hence, with the use of the seed material for liquid phase epitaxial growth of a monocrystalline silicon carbide according to the present invention, an epitaxial growth film of a monocrystalline silicon carbide can be formed with ease at low cost.

Moreover, with the use of the seed material for liquid phase epitaxial growth of a monocrystalline silicon carbide according to the present invention, an epitaxial growth film of a hexagonal monocrystalline silicon carbide having superior properties can be formed. Because the (111) crystal plane is equivalent to the (0001) hexagonal crystal plane, stacking error easily occurs. Thus, it can be considered that if the (111) crystal plane is exposed to a large degree, the epitaxial growth of a hexagonal monocrystalline silicon carbide suitably progresses.

The term "method for liquid phase epitaxial growth" in the present invention refers to a method in which the seed material and the feed material are heated in a position facing each other with a silicon melt layer therebetween to form a concentration gradient of graphite melting in the silicon melt layer and a monocrystalline silicon carbide is epitaxially grown on the seed material using the concentration gradient.

The term "X-ray diffraction" in the present invention refers to diffraction using 8.048 keV X-rays ($CuK_\alpha$ rays).

The term "feed material" in the present invention refers to a material capable of feeding ingredients for epitaxial growth of a monocrystalline silicon carbide, such for example as Si, C, and SiC. On the other hand, the term "seed material" refers to a material on the surface of which a monocrystalline silicon carbide can grow.

In the present invention, it is preferred that upon X-ray diffraction of the surface layer at least one first-order diffraction peak be observed, each first-order diffraction peak corresponding to one of a (111) crystal plane, a (200) crystal plane, a (220) crystal plane, and a (311) crystal plane, and the average crystallite diameter calculated from the at least one first-order diffraction peak be more than 700 Å. With this structure, the rate of epitaxial growth of the monocrystalline silicon carbide can be more effectively increased. The reason for this can be that the surface layer is decreased in proportion of high-reactivity grain boundaries of polycrystalline silicon carbide crystals, which makes it still less likely to cause the elution of the surface layer into the silicon melt layer.

The term "crystallite diameter" in the present invention refers to the crystallite diameter calculated based on the Hall's equation shown in the following formula (1):

$$\beta \cdot (\cos \theta)/\lambda = 2\eta \cdot (\sin \theta)/\lambda + 1/\varepsilon \tag{1}$$

where:
$\beta$ represents the full width at half-maximum;
$\theta$ represents the Bragg angle of the diffraction line;
$\lambda$ represents the wavelength of X-ray used for measurement;
$\eta$ represents the value of inhomogeneous strain of the crystal; and
$\varepsilon$ represents the average crystallite diameter.

In the calculation of the crystallite diameter, the diffraction peak corresponding to the (111) crystal plane and one or more of diffraction peaks corresponding to the (200), (220), and (311) crystal planes and having a peak intensity of 3% or more of the peak intensity of the diffraction peak corresponding to the (111) crystal plane are used.

In the present invention, the proportion of (111) crystal planes having an orientation angle of 67.5° or more in the (111) crystal planes observed by X-ray diffraction of the surface layer is preferably 80% or more. With this structure, the rate of epitaxial growth of the monocrystalline silicon carbide can be still more effectively increased. The reason for this can be that the degree of exposure of crystal planes having lower stability than the (111) crystal plane in the crystals having (111) crystal planes exposed can be reduced, which makes it possible to reduce the elution of the crystals having (111) crystal planes exposed.

In the present invention, it is preferred that an LO peak derived from a polycrystalline silicon carbide with a 3C crystal polymorph be observed upon Raman spectroscopic analysis of the surface layer with an excitation wavelength of 532 nm and that the absolute amount of shift of the LO peak from 972 $cm^{-1}$ be 4 $cm^{-1}$ or more. In this case, the seed material is less likely to cause elution into the silicon melt layer. Therefore, with the use of the seed material having this structure, a concentration gradient in the silicon melt layer can be suitably formed, so that liquid phase epitaxial growth of silicon carbide can be more suitably performed.

Furthermore, with the use of the seed material having this structure, an epitaxial growth film of a hexagonal monocrystalline silicon carbide having even superior properties can be formed. The reason for this can be that the denseness of the surface layer is increased, so that a majority of the crystal planes exposed on the surface of the surface layer have a shape similar to the (0001) hexagonal crystal plane to thereby more suitably promote the epitaxial growth of a hexagonal monocrystalline silicon carbide.

The reason why the elution into the silicon melt layer is less likely to occur when the absolute amount of shift of the LO peak from 972 $cm^{-1}$ is 4 $cm^{-1}$ or more can be that the internal stress of the surface layer of the seed material is increased to increase the denseness of the surface layer.

The term "LO peak derived from a polycrystalline silicon carbide" in the present invention refers to a peak which is derived from the longitudinal optical mode among optical modes of oscillation between the two atoms of Si—C in the silicon carbide crystal and generally, in the case of a 3C polymorph, appears at 972 $cm^{-1}$.

The amount of shift of the LO peak from 972 $cm^{-1}$ is preferably 4 $cm^{-1}$ or more.

The full width at half-maximum of the LO peak is preferably 15 $cm^{-1}$ or less. With the use of the seed material having this structure, the rate of epitaxial growth of the monocrystalline silicon carbide can be still further increased.

The reason why the rate of epitaxial growth of the monocrystalline silicon carbide can be further increased when the full width at half-maximum of the LO peak is 15 $cm^{-1}$ or less can be that smaller full widths at half-maximum of the LO peak can be caused by higher degrees of crystallinity or lower impurity concentrations of the polycrystalline silicon carbide in the surface layer, which makes it still less likely to cause the elution from the surface layer.

In the present invention, the surface layer preferably contains a polycrystalline silicon carbide with a 3C crystal polymorph as a major ingredient and is preferably substantially made of the polycrystalline silicon carbide with a 3C crystal polymorph. With this structure, the rate of epitaxial growth of the monocrystalline silicon carbide can be still more effectively increased.

The term "major ingredient" in the present invention refers to an ingredient which is contained in a proportion of 50% by mass or more in the surface layer.

The expression "substantially made of the polycrystalline silicon carbide with a 3C crystal polymorph" means that the surface layer contains no ingredient other than the polycrystalline silicon carbide with a 3C crystal polymorph, except for impurities. The content of impurities in the surface layer when "substantially made of the polycrystalline silicon carbide with a 3C crystal polymorph" is generally 5% by mass or less.

The seed material for liquid phase epitaxial growth of a monocrystalline silicon carbide according to the present invention may include a support member and a polycrystalline silicon carbide film formed on the support member and forming the surface layer. In this case, the polycrystalline silicon carbide film preferably has a thickness within a range of 30 μm to 800 μm.

The seed material for liquid phase epitaxial growth of a monocrystalline silicon carbide according to the present invention may be formed of a polycrystalline silicon carbide material, such as a polycrystalline silicon carbide substrate containing a polycrystalline silicon carbide with a 3C crystal polymorph.

In a method for liquid phase epitaxial growth of a monocrystalline silicon carbide according to the present invention, the seed material for liquid phase epitaxial growth of a monocrystalline silicon carbide according to the present invention and a feed material including a surface layer containing a polycrystalline silicon carbide with a 3C crystal polymorph are heated with the surface layers of the seed material and the feed material facing each other through a silicon melt layer to epitaxially grow a monocrystalline silicon carbide on the surface layer of the seed material. With this method, an epitaxial growth film of the monocrystalline silicon carbide can be formed at low cost. In addition, there is not necessarily a need to provide a temperature difference between the seed material and the feed material. Therefore, not only the process for epitaxial growth of a monocrystalline silicon carbide can be easily controlled with a simple apparatus but also a high-quality monocrystalline silicon carbide epitaxial growth film can be stably formed.

Advantageous Effects of Invention

The present invention can provide an inexpensive seed material for liquid phase epitaxial growth of silicon carbide.

DESCRIPTION OF EMBODIMENTS

A description will be given below of an example of a preferred embodiment for working of the present invention. However, the following embodiment is simply illustrative. The present invention is not at all limited by the following embodiment.

Figure 1:
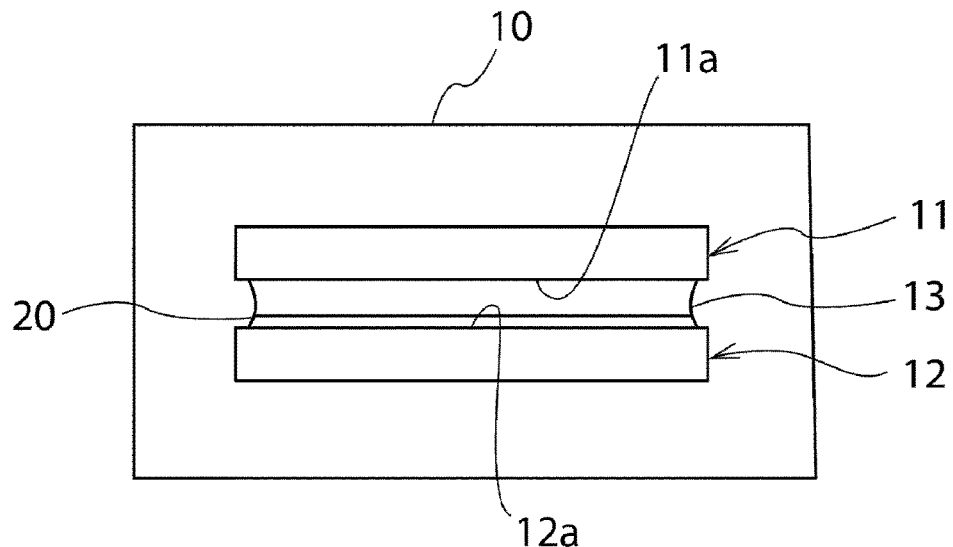
FIG. 1 is a schematic view for illustrating a method for epitaxial growth of a monocrystalline silicon carbide in one embodiment of the present invention.

FIG. 1 is a schematic view for illustrating a method for epitaxial growth of a monocrystalline silicon carbide in this embodiment.

The embodiment describes an example in which an epitaxial growth film of a monocrystalline silicon carbide is formed using MSE.

In this embodiment, as shown in FIG. 1, a seed substrate 12 as the seed material and a feed substrate 11 as the feed material are arranged in a vessel 10 so that a principal surface 12a of the seed substrate 12 and a principal surface 11a of the feed substrate 11 face each other with a silicon plate therebetween. In this position, the seed substrate 12 and the feed substrate 11 are heated to melt the silicon plate. Thus, the seed substrate 12 and the feed substrate 11 are faced each other with a silicon melt layer 13 therebetween. By keeping this state, source materials including silicon, carbon, and silicon carbide are eluted from the seed substrate 12 into the silicon melt layer 13. Thus, a concentration gradient is formed in the silicon melt layer 13. As a result, a monocrystalline silicon carbide epitaxially grows on the principal surface 12a of the seed substrate 12, resulting in the formation of a monocrystalline silicon carbide epitaxial growth film 20. The thickness of the silicon melt layer 13 is extremely small and can be, for example, about 10 μm to about 100 μm.

(Seed Substrate 12)

Figure 3:
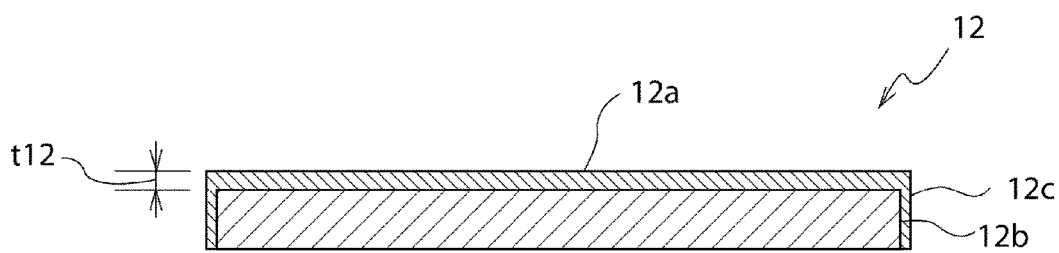
FIG. 3 is a schematic cross-sectional view of a seed substrate in the one embodiment of the present invention.

The seed substrate 12 includes a surface layer containing a polycrystalline silicon carbide with a 3C crystal polymorph. Specifically, in this embodiment, as shown in FIG. 3, the seed substrate 12 includes a graphite-made support member 12b and a polycrystalline silicon carbide film 12c. The graphite-made support member 12b has high thermal resistance so that it can sufficiently withstand the process for epitaxial growth of silicon carbide. Furthermore, the graphite-made support member 12b has a coefficient of thermal expansion similar to that of the monocrystalline silicon carbide epitaxial growth film 20. Therefore, with the use of the graphite-made support member 12b, the monocrystalline silicon carbide epitaxial growth film 20 can be suitably formed.

Specific examples of graphite include natural graphite, artificial graphite, petroleum coke, coal coke, pitch coke, carbon black, and mesocarbon. An example of a method for producing the graphite-made support member 12b is a production method described in JP-A-2005-132711.

The polycrystalline silicon carbide film 12c is formed to cover the principal and side surfaces of the support member 12b. The polycrystalline silicon carbide film 12c contains a polycrystalline silicon carbide. The surface layer of the seed substrate 12 is formed of the polycrystalline silicon carbide film 12c. The polycrystalline silicon carbide film 12c in this embodiment preferably contains polycrystalline 3C—SiC as a major ingredient and is preferably substantially made of polycrystalline 3C—SiC. In other words, in this embodiment, the surface layer of the seed substrate 12 preferably contains polycrystalline 3C—SiC as a major ingredient and is preferably substantially made of polycrystalline 3C—SiC. Thus, the rate of growth of the monocrystalline silicon carbide epitaxial growth film 20 can be increased.

The thickness t12 of the polycrystalline silicon carbide film 12c is preferably within a range of 30 μm to 800 μm, more preferably within a range of 40 μm to 600 μm, and still more preferably within a range of 100 μm to 300 μm. If the thickness t12 of the polycrystalline silicon carbide film 12c is too small, the graphite-made support member 12b may be exposed during the formation of a monocrystalline silicon carbide epitaxial growth film 20, thus causing elution from the support member 12b and resulting in failure to obtain a suitable monocrystalline silicon carbide epitaxial growth film 20. On the other hand, if the thickness t12 of the polycrystalline silicon carbide film 12c is too large, the polycrystalline silicon carbide film 12c may be likely to produce cracks.

No particular limitation is placed on the method for forming the polycrystalline silicon carbide film 12c. The polycrystalline silicon carbide film 12c can be formed, for example, by CVD (chemical vapor deposition) or sputtering. Particularly in this embodiment, since the polycrystalline silicon carbide film 12c contains polycrystalline 3C—SiC, a dense polycrystalline silicon carbide film 12c can be formed with ease at low cost by CVD.

The polycrystalline silicon carbide film 12c forming the surface layer of the seed substrate 12 is such that when it is subjected to X-ray diffraction, a first-order diffraction peak corresponding to the (111) crystal plane is observed as a diffraction peak corresponding to a crystal polymorph of polycrystalline 3C—SiC but no other first-order diffraction peak having a diffraction intensity of 10% or more of the diffraction intensity of the first-order diffraction peak corresponding to the (111) crystal plane is observed.

Furthermore, when the polycrystalline silicon carbide film 12c forming the surface layer of the seed substrate 12 is subjected to Raman spectroscopic analysis with an excitation wavelength of 532 nm, an LO peak derived from a polycrystalline silicon carbide with a 3C crystal polymorph is observed. The absolute amount of shift of the LO peak from 972 $cm^{-1}$ is 4 $cm^{-1}$ or more.

As described above, it has been heretofore considered that the feed material and the seed material should be selected so that the feed material has a higher free energy than the seed material and that if a 3C—SiC substrate having a low free energy is used as the feed substrate, a 3C—SiC substrate cannot be used as the seed substrate and a silicon carbide substrate having a different crystal polymorph, such as a 4H—SiC substrate or a 6H—SiC substrate, should be used as the seed substrate.

However, the inventors have found through intensive studies that, among 3C—SiC substrates, there are substrates likely to be eluted into a silicon melt layer and substrates less likely to be eluted into a silicon melt layer and that the 3C—SiC substrates less likely to be eluted into a silicon melt layer can be suitably used as the seed material for liquid phase epitaxial growth of silicon carbide. Furthermore, the inventors have found through further intensive studies that if upon X-ray diffraction no other first-order diffraction peak having a diffraction intensity of 10% or more of the diffraction intensity of the first-order diffraction peak corresponding to the (111) crystal plane is observed as a diffraction peak corresponding to a crystal polymorph of polycrystalline 3C—SiC, the elution into the silicon melt layer becomes less likely to occur. Based on these findings, the inventors used as the seed substrate 12 a substrate including a surface layer in which upon X-ray diffraction thereof a first-order diffraction peak corresponding to a (111) crystal plane was observed as a diffraction peak corresponding to a crystal polymorph of polycrystalline 3C—SiC but no other first-order diffraction peak having a diffraction intensity of 10% or more of the diffraction intensity of the first-order diffraction peak corresponding to the (111) crystal plane was observed. Thus, even with the use of the seed substrate 12 having a surface layer containing polycrystalline 3C—SiC and producible at low cost by CVD, silicon carbide could be suitably epitaxially grown. The reason why the elution into the silicon melt layer becomes less likely to occur when no other first-order diffraction peak having a diffraction intensity of 10% or more of the diffraction intensity of the first-order diffraction peak corresponding to the (111) crystal plane is observed can be that the (111) crystal plane is a crystal plane less likely to be eluted into the silicon melt layer than the other crystal planes.

Examples of diffraction peaks corresponding to a crystal polymorph of polycrystalline 3C—SiC include the peaks shown in Table 1 below.

TABLE 1

| Corresponding Crystal Plane | 2θ (°) |
| --- | --- |
| (111) | 35.6 |
| (200) | 41.4 |
| (220) | 60.0 |
| (311) | 71.7 |

Furthermore, with the use of the seed substrate 12 of this embodiment, an epitaxial growth film of a hexagonal monocrystalline silicon carbide having superior properties can be formed. The reason for this can be that because the (111) crystal plane is equivalent to the (0001) hexagonal crystal plane, a large degree of exposure of the (111) crystal plane suitably promotes the epitaxial growth of a hexagonal monocrystalline silicon carbide.

Typical examples of the hexagonal monocrystalline silicon carbide include a monocrystalline silicon carbide with a 4H crystal polymorph and a monocrystalline silicon carbide with a 6H crystal polymorph. These monocrystalline silicon carbides with a 4H or 6H crystal polymorph (4H—SiC and 6H—SiC) have the advantage of enabling semiconductor devices having a larger band gap and higher thermal resistance than other silicon carbides with different crystal polymorphs.

Furthermore, the polycrystalline silicon carbide film 12c is preferably such that the average crystallite diameter calculated from the first-order diffraction peak observed by X-ray diffraction and corresponding to the polycrystalline silicon carbide with a 3C crystal polymorph is more than 700 Å. In this case, the rate of growth of the monocrystalline silicon carbide epitaxial growth film 20 can be still further increased. The reason for this can be that the polycrystalline silicon carbide film 12c is decreased in proportion of high-reactivity grain boundaries of polycrystalline silicon carbide crystals, which makes it still less likely to cause the elution of the polycrystalline silicon carbide film 12c into the silicon melt layer.

Moreover, the polycrystalline silicon carbide film 12c is preferably such that the proportion of (111) crystal planes having an orientation angle of 67.5° or more in the (111) crystal planes observed by X-ray diffraction is 80% or more. In this case, the rate of growth of the monocrystalline silicon carbide epitaxial growth film 20 can be still more effectively increased. The reason for this can be that the degree of exposure of crystal planes having lower stability than the (111) crystal plane in the crystals having (111) crystal planes exposed can be reduced, which makes it possible to reduce the elution of the crystals having (111) crystal planes exposed.

Moreover, in the polycrystalline silicon carbide film 12c, an LO peak derived from a polycrystalline silicon carbide with a 3C crystal polymorph is observed upon Raman spectroscopic analysis with an excitation wavelength of 532 nm and the absolute amount of shift of the LO peak from 972 cm$^{-1}$ is 4 cm$^{-1}$ or more. Therefore, the elution into the silicon melt layer is still less likely to occur, so that the liquid phase epitaxial growth of the film can be more suitably performed. The reason why the elution into the silicon melt layer is less likely to occur when the absolute amount of shift of the LO peak from 972 cm$^{-1}$ is 4 cm$^{-1}$ or more can be that the internal stress of the surface layer of the seed substrate 12 is increased to increase the denseness of the surface layer.

Furthermore, it can be considered that when the absolute amount of shift of the LO peak from 972 cm$^{-1}$ is 4 cm$^{-1}$ or more, the denseness of the polycrystalline silicon carbide film 12c is increased, so that a majority of the crystal planes exposed on the surface of the polycrystalline silicon carbide film 12c have a shape similar to the (0001) hexagonal crystal plane to thereby more suitably promote the epitaxial growth of a hexagonal monocrystalline silicon carbide.

In this embodiment, the amount of shift of the LO peak from 972 cm$^{-1}$ is preferably 4 cm$^{-1}$ or more.

Furthermore, the full width at half-maximum of the LO peak is preferably 15 cm$^{-1}$ or less. In this case, the rate of epitaxial growth of the monocrystalline silicon carbide can be still further increased.

The reason why the rate of epitaxial growth of the monocrystalline silicon carbide can be further increased when the full width at half-maximum of the LO peak is 15 cm$^{-1}$ or less can be that smaller full widths at half-maximum of the LO peak can be caused by higher degrees of crystallinity or lower impurity concentrations of the polycrystalline silicon carbide in the surface layer of the seed substrate 12, which makes it still less likely to cause the elution from the surface layer of the seed substrate 12.

(Feed Substrate 11)

In this embodiment, no particular limitation is placed on the material of the feed substrate 11 so long as it is less likely to cause the elution into the silicon melt layer 13 than the seed substrate 12. Therefore, an example of the feed substrate 11 that can be suitably used is a substrate which includes a surface layer containing a polycrystalline silicon carbide with a 3C crystal polymorph and in which upon X-ray diffraction of the surface layer a diffraction peak corresponding to the (111) crystal plane and a diffraction peak other than the diffraction peak corresponding to the (111) crystal plane are observed.

Furthermore, an example of the feed substrate 11 that can be more suitably used is a substrate which includes a surface layer containing a polycrystalline silicon carbide with a 3C crystal polymorph and in which the absolute amount of shift of the LO peak observed by Raman spectroscopic analysis of the surface layer with an excitation wavelength of 532 nm from 972 cm$^{-1}$ is less than 4 cm$^{-1}$.

Figure 2:
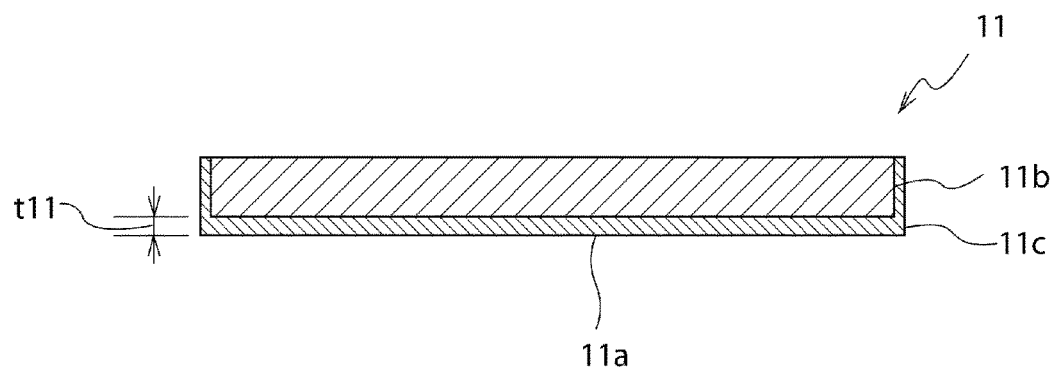
FIG. 2 is a schematic cross-sectional view of a feed substrate in the one embodiment of the present invention.

FIG. 2 shows a schematic cross-sectional view of the feed substrate 11 in this embodiment. Specifically, in this embodiment, as shown in FIG. 2, the feed substrate 11 includes a graphite-made support member 11b and a polycrystalline silicon carbide film 11c. The graphite-made support member 11b has high thermal resistance so that it can sufficiently withstand the process for epitaxial growth of silicon carbide. Furthermore, the graphite-made support member 11*b* has a coefficient of thermal expansion similar to that of the monocrystalline silicon carbide epitaxial growth film 20. Therefore, with the use of the graphite-made support member 11*b*, the silicon carbide epitaxial growth film 20 can be suitably formed.

Specific examples of graphite include natural graphite, artificial graphite, petroleum coke, coal coke, pitch coke, carbon black, and mesocarbon. An example of a method for producing the graphite-made support member 11*b* is a production method described in JP-A-2005-132711.

The polycrystalline silicon carbide film 11*c* is formed to cover the principal and side surfaces of the support member 11*b*. The polycrystalline silicon carbide film 11*c* contains a polycrystalline silicon carbide. The surface layer of the feed substrate 11 is formed of the polycrystalline silicon carbide film 11*c*. The polycrystalline silicon carbide film 11*c* preferably contains polycrystalline 3C—SiC as a major ingredient and is preferably substantially made of polycrystalline 3C—SiC. In other words, the surface layer of the feed substrate 11 preferably contains polycrystalline 3C—SiC as a major ingredient and is preferably substantially made of polycrystalline 3C—SiC. Thus, the rate of growth of the monocrystalline silicon carbide epitaxial growth film 20 can be increased.

The thickness t11 of the polycrystalline silicon carbide film 11*c* is preferably within a range of 30 μm to 800 μm, more preferably within a range of 40 μm to 600 μm, and still more preferably within a range of 100 μm to 300 μm. If the thickness t11 of the polycrystalline silicon carbide film 11*c* is too small, the graphite-made support member 11*b* may be exposed during the formation of a monocrystalline silicon carbide epitaxial growth film 20, thus causing elution from the support member 11*b* and resulting in failure to obtain a suitable monocrystalline silicon carbide epitaxial growth film 20. On the other hand, if the thickness t11 of the polycrystalline silicon carbide film 11*c* is too large, the polycrystalline silicon carbide film 11*c* may be likely to produce cracks.

No particular limitation is placed on the method for forming the polycrystalline silicon carbide film 11*c*. The polycrystalline silicon carbide film 11*c* can be formed, for example, by CVD (chemical vapor deposition) or sputtering. Particularly in this embodiment, since the polycrystalline silicon carbide film 11*c* contains polycrystalline 3C—SiC, a dense polycrystalline silicon carbide film 11*c* can be formed with ease at low cost by CVD.

The polycrystalline silicon carbide film 11*c* forming the surface layer of the feed substrate 11 is such that when it is subjected to X-ray diffraction, a diffraction peak corresponding to the (111) crystal plane and a diffraction peak other than the diffraction peak corresponding to the (111) crystal plane are observed as diffraction peaks corresponding to a crystal polymorph of polycrystalline 3C—SiC. More specifically, the polycrystalline silicon carbide film 11*c* is such that when it is subjected to X-ray diffraction, a diffraction peak corresponding to the (111) crystal plane and at least one diffraction peak each corresponding to one of the (200) crystal plane, the (220) crystal plane, and the (311) crystal plane are observed as diffraction peaks corresponding to a crystal polymorph of polycrystalline 3C—SiC. Therefore, in this embodiment, the monocrystalline silicon carbide epitaxial growth film 20 can be formed at a high rate of growth. A possible reason for this is that the crystal planes other than the (111) crystal plane are more likely to cause the elution into the silicon melt layer 13 than the (111) crystal plane.

The polycrystalline silicon carbide film 11*c* is such that when subjected to X-ray diffraction, in addition to a diffraction peak corresponding to the (111) crystal plane, at least one diffraction peak each corresponding to one of the (200) crystal plane, the (220) crystal plane, and the (311) crystal plane is preferably observed as a diffraction peak corresponding to a crystal polymorph of polycrystalline 3C—SiC and, more preferably, diffraction peaks each corresponding to one of the (200) crystal plane, the (220) crystal plane, and the (311) crystal plane are observed. In this case, the rate of growth of the monocrystalline silicon carbide epitaxial growth film 20 can be further increased. The reason for this can be that, among the crystal planes other than the (111) crystal plane, the (200) crystal plane, the (220) crystal plane, and the (311) crystal plane have particularly high reactivity and thus are more likely to cause the elution into the silicon melt layer 13.

Moreover, the sum of the intensities of first-order diffraction peaks other than the first-order diffraction peak corresponding to the (111) crystal plane is preferably 10% or more of the sum of the intensities of all the first-order diffraction peaks and more preferably 20% or more thereof. In this case, the rate of growth of the monocrystalline silicon carbide epitaxial growth film 20 can be still further increased.

Among a plurality of first-order diffraction peaks observed as diffraction peaks corresponding to a crystal polymorph of polycrystalline 3C—SiC when the polycrystalline silicon carbide film 11*c* is subjected to X-ray diffraction, a first-order diffraction peak corresponding to the (111) crystal plane is preferably a main diffraction peak having the highest diffraction intensity.

Furthermore, the polycrystalline silicon carbide film 11*c* is preferably such that the average crystallite diameter calculated from the first-order diffraction peak observed by X-ray diffraction and corresponding to the polycrystalline silicon carbide with a 3C crystal polymorph is 700 Å or less. In this case, the rate of growth of the monocrystalline silicon carbide epitaxial growth film 20 can be still further increased. The reason for this can be that the polycrystalline silicon carbide film 11*c* is increased in proportion of high-reactivity grain boundaries of polycrystalline silicon carbide crystals, which makes it more likely to cause the elution from the polycrystalline silicon carbide film 11*c*.

Furthermore, the polycrystalline silicon carbide film 11*c* is preferably such that when subjected to X-ray diffraction, a first-order diffraction peak corresponding to the (111) crystal plane and at least one first-order diffraction peak each corresponding to one of the (200) crystal plane, the (220) crystal plane, and the (311) crystal plane are observed and $(I_1/I_0)^{-1} \cdot D^2$ is equal to or smaller than $10^8$, where:

$I_0$ represents the sum of the intensity of the first-order diffraction peak corresponding to the (111) crystal plane and the total intensity of the at least one first-order diffraction peak each corresponding to one of the (200) crystal plane, the (220) crystal plane, and the (311) crystal plane;

$I_1$ represents the total intensity of the at least one first-order diffraction peak each corresponding to one of the (200) crystal plane, the (220) crystal plane, and the (311) crystal plane; and D represents the average crystallite diameter calculated using the Hall's equation from the at least one first-order diffraction peak each corresponding to one of the (200) crystal plane, the (220) crystal plane, and the (311) crystal plane.

In this case, the rate of growth of the monocrystalline silicon carbide epitaxial growth film 20 can be still more effectively increased. The reason for this can be that the polycrystalline silicon carbide film 11c is increased in proportion of (200), (220), and (311) crystal planes having relatively high reactivity and is decreased in average crystallite diameter.

Moreover, the polycrystalline silicon carbide film 11c is preferably such that the proportion of (111) crystal planes having an orientation angle of 67.5° or more in the (111) crystal planes observed by X-ray diffraction is less than 80%. In this case, the rate of growth of the monocrystalline silicon carbide epitaxial growth film 20 can be still more effectively increased. The reason for this can be that the degree of exposure of crystal planes having lower stability than the (111) crystal plane in the crystals having (111) crystal planes exposed is increased, which makes it possible to increase the reactivity of the crystals having (111) crystal planes exposed.

The polycrystalline silicon carbide film 11c forming the surface layer of the feed substrate 11 is such that the absolute amount of shift of the LO peak observed by Raman spectroscopic analysis with an excitation wavelength of 532 nm from 972 $cm^{-1}$ is less than 4 $cm^{-1}$. Therefore, in this embodiment, the monocrystalline silicon carbide epitaxial growth film 20 can be formed at a high rate of growth.

Figure 4:
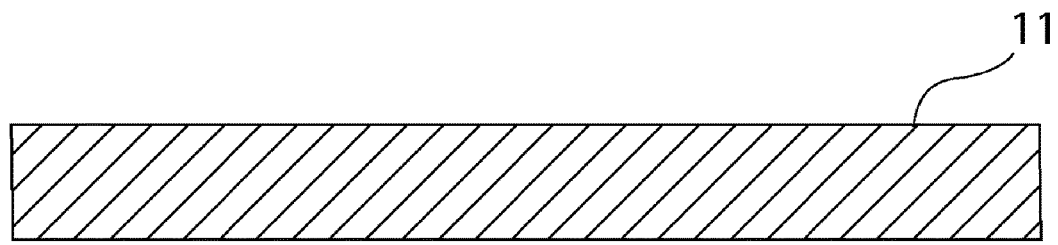
FIG. 4 is a schematic cross-sectional view of a feed substrate in a modification.
Figure 5:
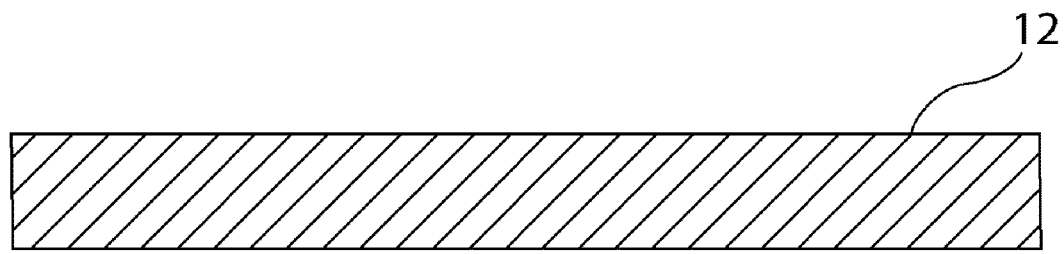
FIG. 5 is a schematic cross-sectional view of a seed substrate in the modification.

The above embodiment has described an example in which each of the feed substrate 11 and the seed substrate 12 is formed of a support member 11b or 12b and a polycrystalline silicon carbide film 11c or 12c. However, the present invention is not limited to the above structure. For example, as shown in FIG. 4, the feed substrate 11 may be formed of a silicon carbide substrate containing silicon carbide. Furthermore, as shown in FIG. 5, the seed substrate 12 may be formed of a polycrystalline silicon substrate containing a polycrystalline silicon carbide with a 3C crystal polymorph.

The silicon carbide substrate can be produced, for example, by coating a graphite base material with a polycrystalline silicon carbide by CDV and then mechanically or chemically removing graphite. Alternatively, the silicon carbide substrate can be produced by reacting a graphite material with silicate gas to convert the graphite material into silicon carbide. Still alternatively, the silicon carbide substrate can be produced by adding a sintering aid to silicon carbide powder and sintering the silicon carbide powder at a high temperature of 1600° C. or above.

The present invention will be further described below with reference to specific examples, but is not at all limited by the following specific examples.

Production Example 1

A graphite material (15 mm by 15 mm by 2 mm) made of high-purity isotropic graphite having a bulk density of 1.85 g/$cm^3$ and an ash content of 5 ppm or less was used as a base material. The base material was put into a CVD reactor and a 30 μm thick polycrystalline silicon carbide coating was formed on the base material by CVD to produce Sample 1. Silicon tetrachloride and propane gas were used as source gases. The deposition was performed at an ordinary pressure and 1200° C. The deposition rate was at 30 μm/h.

Production Example 2

A 50 μm thick polycrystalline silicon carbide coating was formed on the surface of a graphite material in the same manner as in Production Example 1 above except that the reaction temperature was at 1400° C. and the deposition rate was at 60 μm/h, resulting in the production of Sample 2.

Production Example 3

A 50 μm thick polycrystalline silicon carbide coating was formed on the surface of a graphite material in the same manner as in Production Example 1 above except that the reaction temperature was at 1250° C., the deposition rate was at 10 μm/h, and $CH_3SiCl_3$ was used instead of silicon tetrachloride, resulting in the production of Sample 3.

Production Example 4

A 50 μm thick polycrystalline silicon carbide coating was formed on the surface of a graphite material in the same manner as in Production Example 1 above except that dichlorosilane ($SiH_2Cl_2$) and acetylene were used instead of silicon tetrachloride and propane gas, the reaction temperature was at 1300° C., and the deposition rate was at 10 μm/h, resulting in the production of Sample 4. In Sample 4, the thickness of the polycrystalline silicon carbide coating was approximately 1 mm.

(X-Ray Diffraction Measurement)

The surface layers of the above produced Samples 1 to 4 were subjected to X-ray diffraction. The X-ray diffraction was performed using Ultima manufactured by Rigaku Corporation. The measurement results are shown in FIG. 6.

Figure 6:
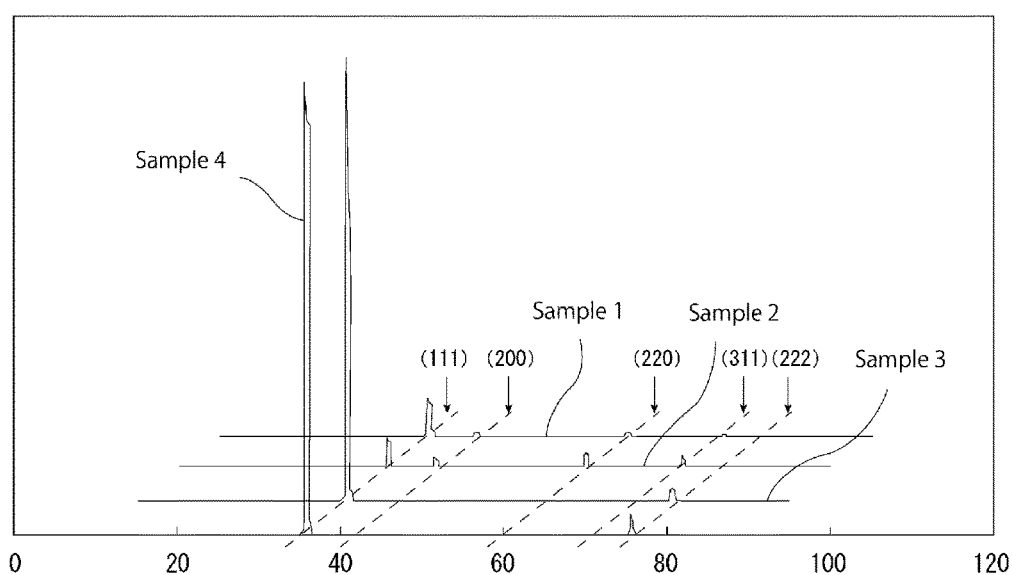
FIG. 6 is an X-ray diffraction chart relating to Samples 1 to 4.

As shown in FIG. 6, in Samples 1 and 2, not only a diffraction peak (2θ=35.6° corresponding to the (111) crystal plane but also diffraction peaks corresponding to crystal planes other than the (111) crystal plane and having an intensity of 10% or more of the intensity of the diffraction peak corresponding to the (111) crystal plane were observed. Specifically, in Samples 1 and 2, besides a diffraction peak (2θ=35.6° corresponding to the (111) crystal plane, a diffraction peak) (2θ=41.4° corresponding to the (200) crystal plane, a diffraction peak)(2θ=60.0° corresponding to the (220) crystal plane, and a diffraction peak)(2θ=71.7° corresponding to the (311) crystal plane, all of which have an intensity of 10% or more of the intensity of the diffraction peak corresponding to the (111) crystal plane, were observed.

On the other hand, in Samples 3 and 4, a first-order diffraction peak)(2θ=35.6° corresponding to the (111) crystal plane and a diffraction peak)(2θ=75.5° corresponding to the (222) crystal plane, which is a higher-order diffraction peak of the above first-order diffraction peak, were observed, but no other first-order diffraction peak having an intensity of 10% or more of the intensity of the first-order diffraction peak corresponding to the (111) crystal plane was observed.

Arranged in Table 2 below are the relative intensities of the first-order diffraction peaks corresponding to various crystal planes in Samples 1 to 4, with 100 representing the intensity of the first-order diffraction peak corresponding to the (111) crystal plane.

TABLE 2

| Corresponding | Relative Intensity of First-Order Diffraction Peak | | | |
|---|---|---|---|---|
| Crystal Plane | Sample 1 | Sample 2 | Sample 3 | Sample 4 |
| (111) | 100 | 100 | 100 | 100 |
| (200) | 13 | 40 | 0 | 0 |

TABLE 2-continued

| Corresponding Crystal Plane | Relative Intensity of First-Order Diffraction Peak | | | |
|---|---|---|---|---|
| | Sample 1 | Sample 2 | Sample 3 | Sample 4 |
| (220) | 12 | 51 | 0 | 0 |
| (311) | 12 | 47 | 1 | 0 |

(Calculation of Average Crystallite Diameter)

The average crystallite diameters of Samples 1 to 4 were calculated based on the results of the above X-ray diffraction measurement, using the Hall's equation. In the calculation, data of diffraction peaks relating to the (111) crystal plane, the (200) crystal plane, the (220) crystal plane, and the (311) crystal plane were used. The results are shown in Table 3 below.

TABLE 3

| | Average Crystallite Diameter (Å) |
|---|---|
| Sample 1 | 350 |
| Sample 2 | 455 |
| Sample 3 | 1136 |
| Sample 4 | 1012 |

As seen from the results shown in Table 3 above, the average crystallite diameters of Samples 1 and 2 were less than 700 Å, more specifically, less than 500 Å and the average crystallite diameters of Samples 3 and 4 were more than 700 Å, more specifically, more than 1000 Å.

(Evaluation of Orientation of (111) Crystal Plane)

Figure 7:
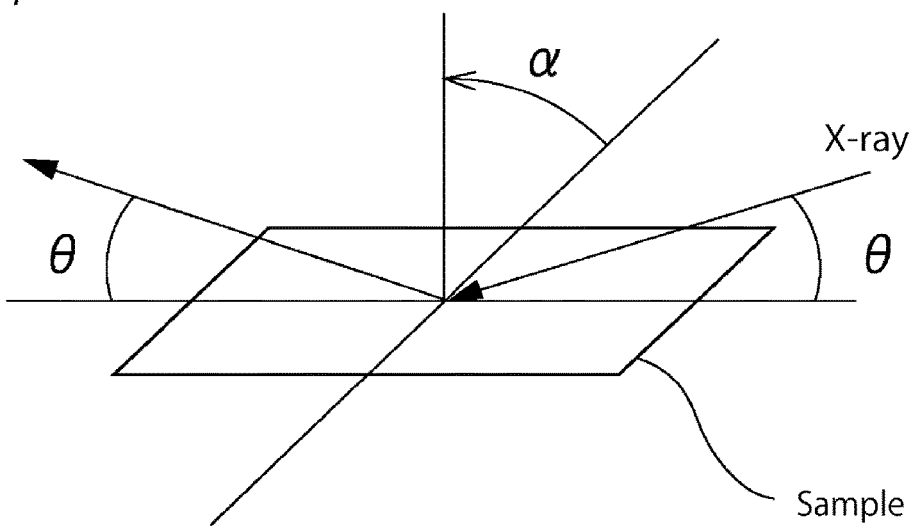
FIG. 7 is a schematic diagram for illustrating a method for measuring the orientation of a (111) crystal plane.

Next, Samples 1 to 4 were measured in terms of angle at which the diffraction peak corresponding to the (111) plane appeared while each of them was rotated as shown in FIG. 7. The results are shown in FIGS. 8 to 11. In the graphs shown in FIGS. 8 to 11, the abscissa represents the orientation angle ($\alpha$) shown in FIG. 7. The ordinate represents the intensity.

Furthermore, Table 4 below shows the proportion of the intensity integral in a region of 67.5° and higher orientation angles ($\alpha$) to the intensity integral in an entire region of 15° to 90° orientation angles ($\alpha$) ((intensity integral in region of 67.5° and higher orientation angles ($\alpha$))/(intensity integral in entire region of 15° to 90° orientation angles ($\alpha$)). Note that the ((intensity integral in region of 67.5° and higher orientation angles ($\alpha$))/(intensity integral in entire region of 15° to 90° orientation angles ($\alpha$)) corresponds to the proportion of (111) crystal plane having an orientation angle of 67.5° or more in the (111) crystal planes observed by X-ray diffraction.

TABLE 4

| | Proportion of (111) Crystal Planes Having 67.5° C. or Higher Orientation Angle |
|---|---|
| Sample 1 | 38.6% |
| Sample 2 | 48.5% |
| Sample 3 | 96.5% |
| Sample 4 | 96.9% |

Figure 8:
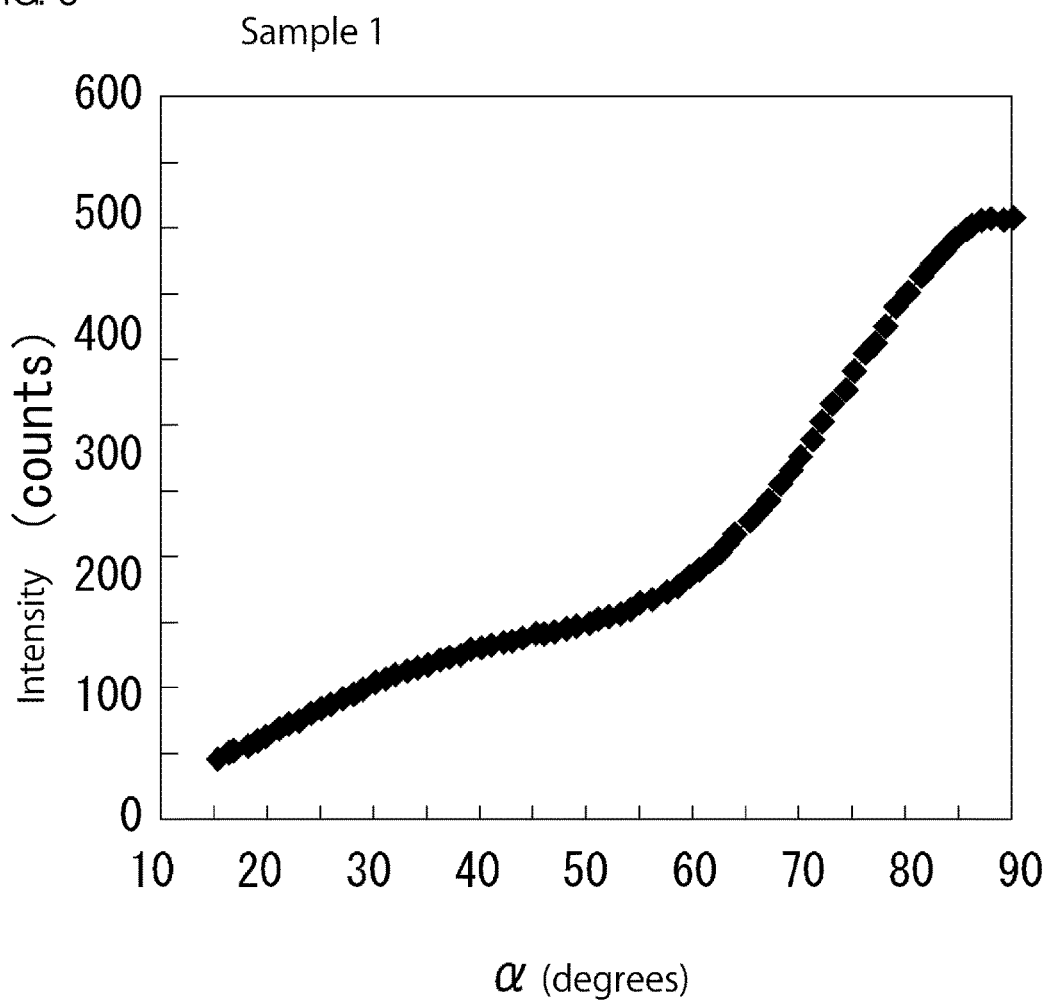
FIG. 8 is a graph showing the orientation of the (111) crystal plane in Sample 1.
Figure 9:
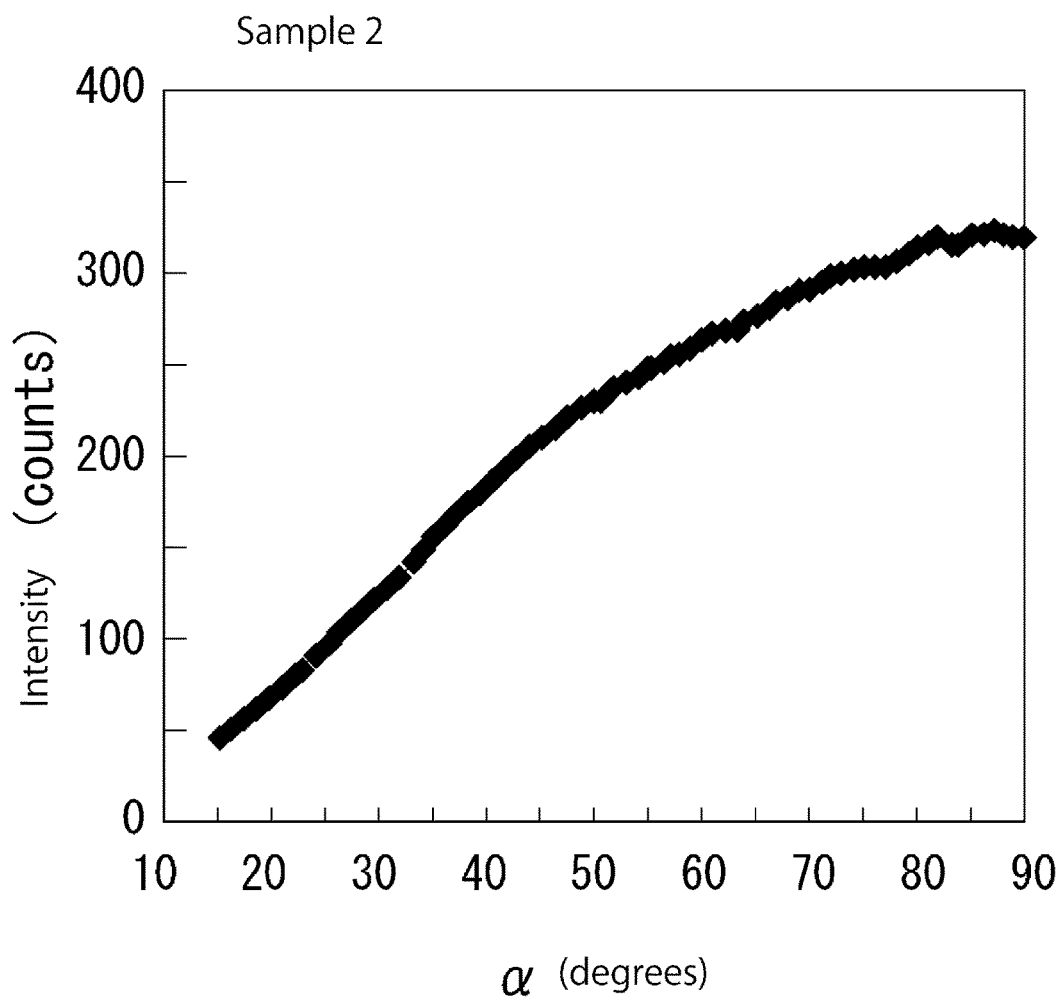
FIG. 9 is a graph showing the orientation of the (111) crystal plane in Sample 2.
Figure 10:
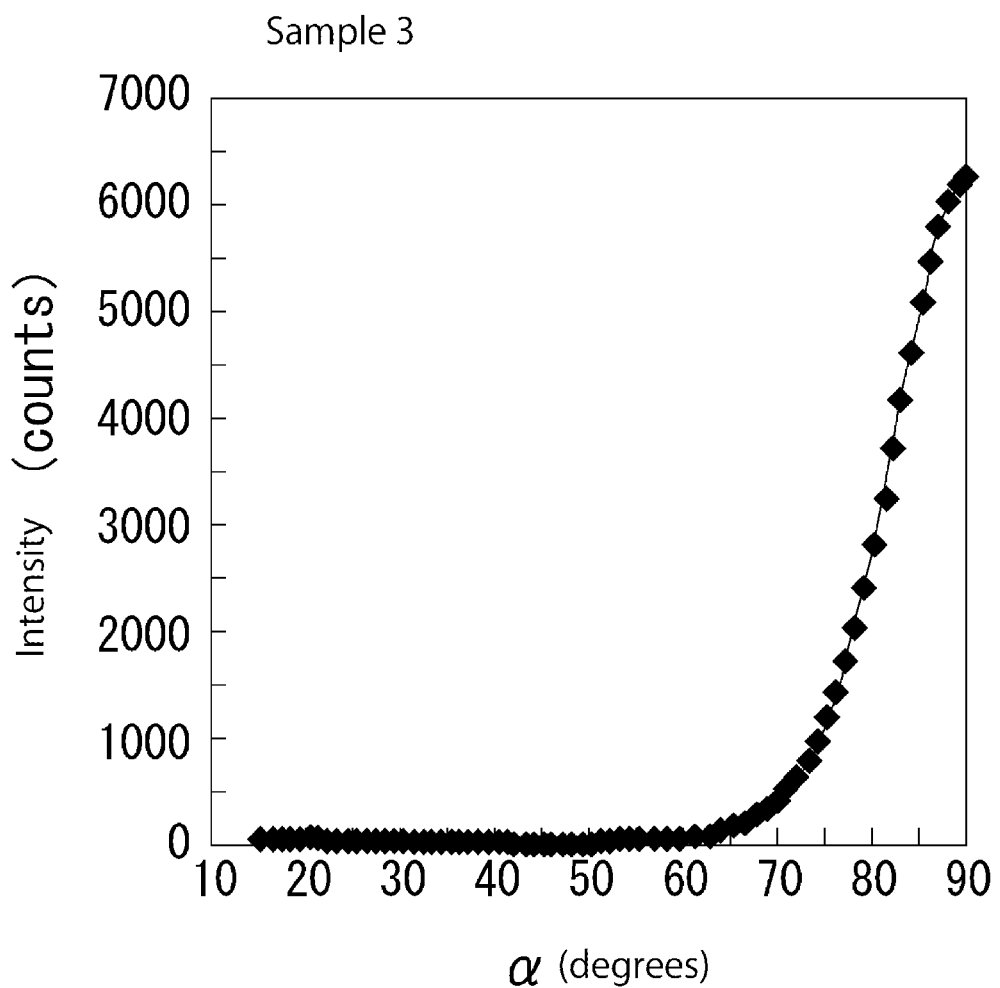
FIG. 10 is a graph showing the orientation of the (111) crystal plane in Sample 3.
Figure 11:
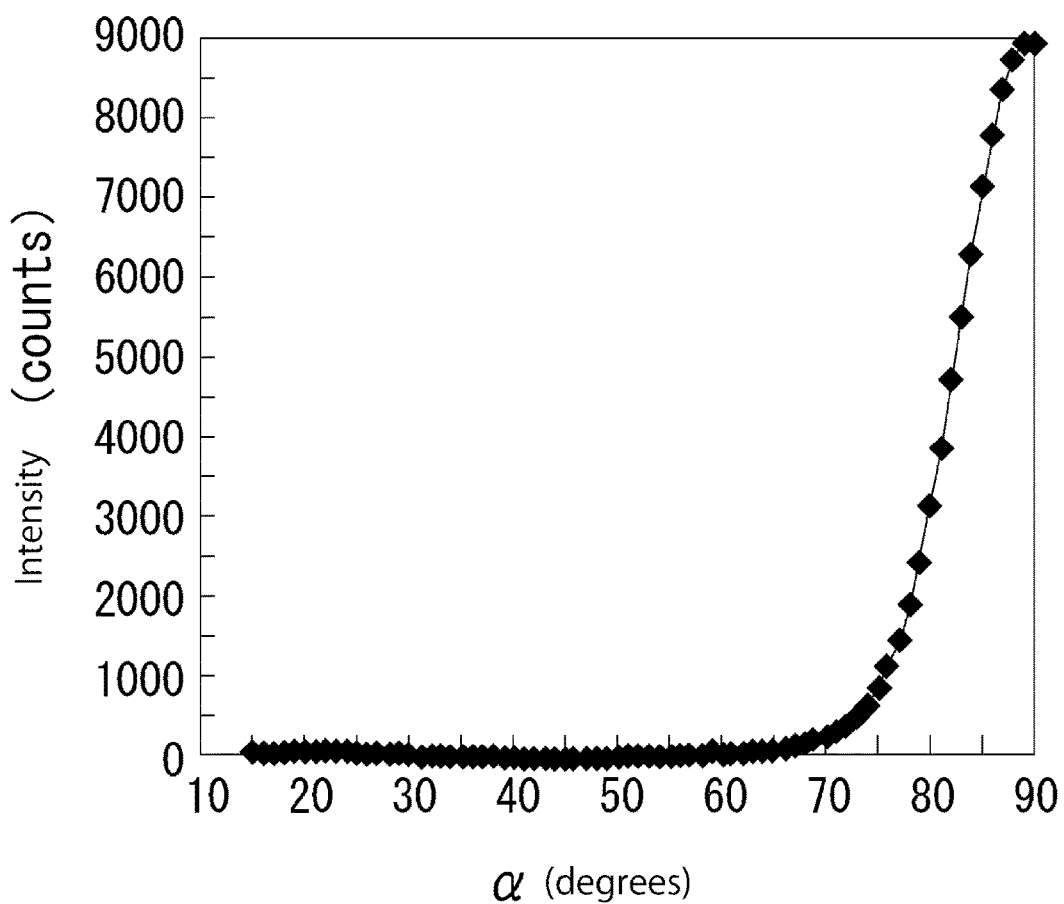
FIG. 11 is a graph showing the orientation of the (111) crystal plane in Sample 4.

As shown in FIGS. 8 and 9 and Table 4 above, in Samples 1 and 2, a wide intensity distribution existed also in a region of orientation angles ($\alpha$) less than 67.5° and the proportion of (111) crystal planes having an orientation angle ($\alpha$) of 67.5° or more was less than 80%. On the other hand, in Samples 3 and 4, no wide intensity distribution existed in a region of orientation angles ($\alpha$) less than 67.5° and the proportion of (111) crystal planes having an orientation angle ($\alpha$) of 67.5° or more was more than 80%.

(Raman Spectroscopic Analysis)

The surface layers of the above produced Samples 1 to 4 were subjected to Raman spectroscopic analysis. An excitation wavelength of 532 nm was used for the Raman spectroscopic analysis. The measurement results are shown in FIG. 12.

Figure 12:
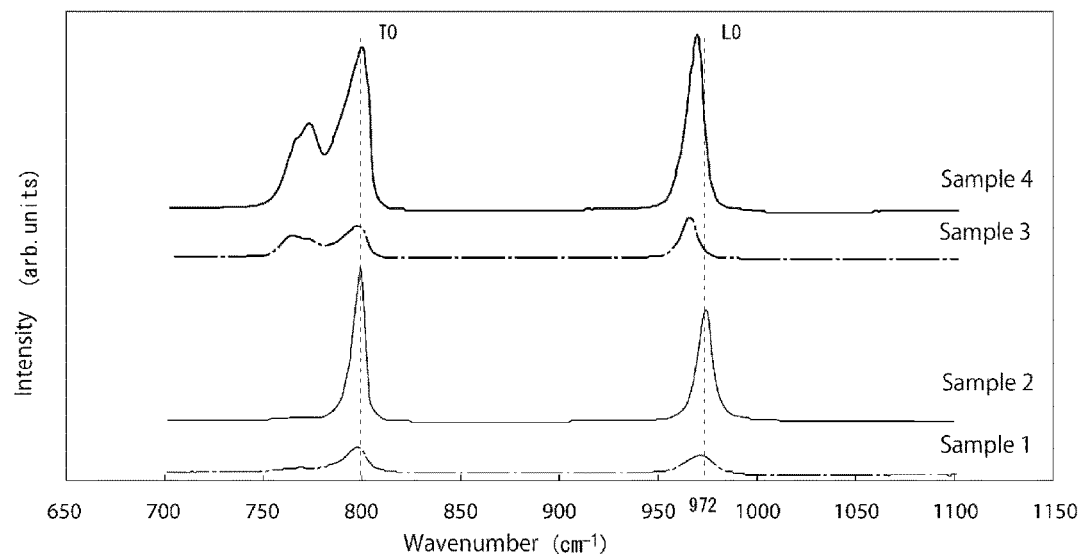
FIG. 12 is a graph showing the amounts (Δω) of shift of LO peaks from 972 $cm^{-1}$ in Samples 1 to 4 and the full widths at half-maximum (FWHM) of the LO peaks.

Next, from the measurement results shown in FIG. 12, the amounts ($\Delta\omega$) of shift of LO peaks from 972 $cm^{-1}$ in Samples 1 to 4 and full widths at half-maximum (FWHM) of the LO peaks were determined. The results are shown in FIG. 13.

Figure 13:
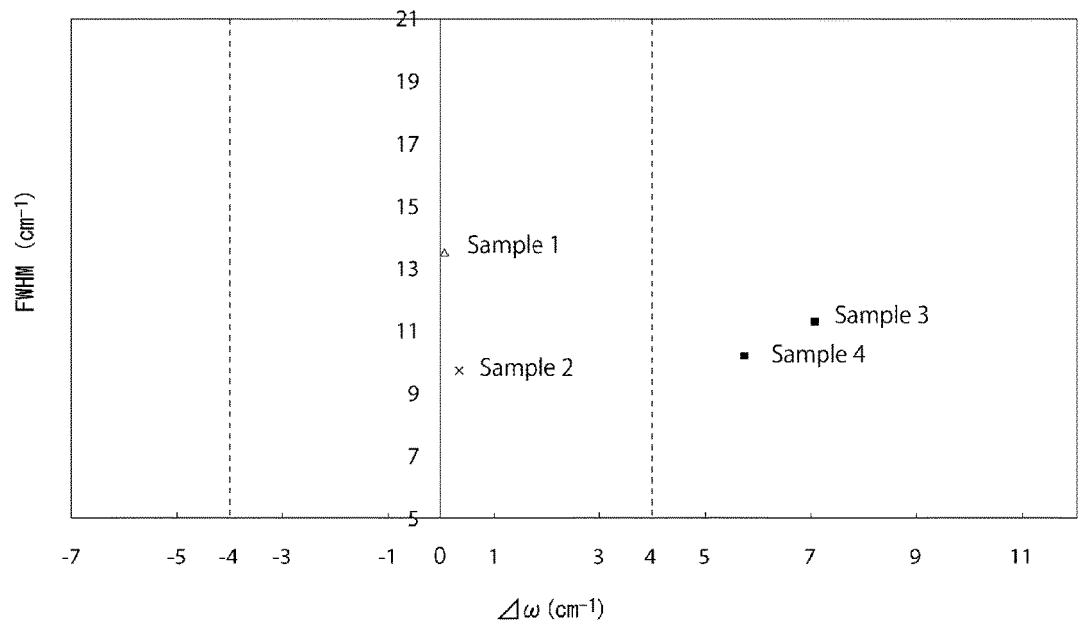
FIG. 13 is a graph showing the rates of growth of monocrystalline silicon carbide epitaxial growth films in Samples 1, 2, and 4.

As shown in FIG. 13, Samples 3 and 4 each had an absolute value of $\Delta\omega$ of more than 4 $cm^{-1}$ and an FWHM of more than 7 $cm^{-1}$. On the other hand, Samples 1 and 2 each had an FWHM of more than 7 $cm^{-1}$ like Samples 3 and 4, but their absolute values of $\Delta\omega$ were less than 4 $cm^{-1}$.

(Evaluation of Rate of Growth of Monocrystalline Silicon Carbide Liquid Phase Epitaxial Growth Film)

Using Samples 1 to 4 as feed substrates, respective monocrystalline silicon carbide epitaxial growth films 20 were produced under the conditions shown below by the method for liquid phase epitaxial growth described in the above embodiment. Then, the thickness of each of the monocrystalline silicon carbide epitaxial growth films 20 was measured by observing the cross section of the monocrystalline silicon carbide epitaxial growth film 20 with an optical microscope. The rate of growth of each monocrystalline silicon carbide epitaxial growth film 20 was determined by dividing the measured thickness by the time for epitaxial growth of silicon carbide.

Figure 14:
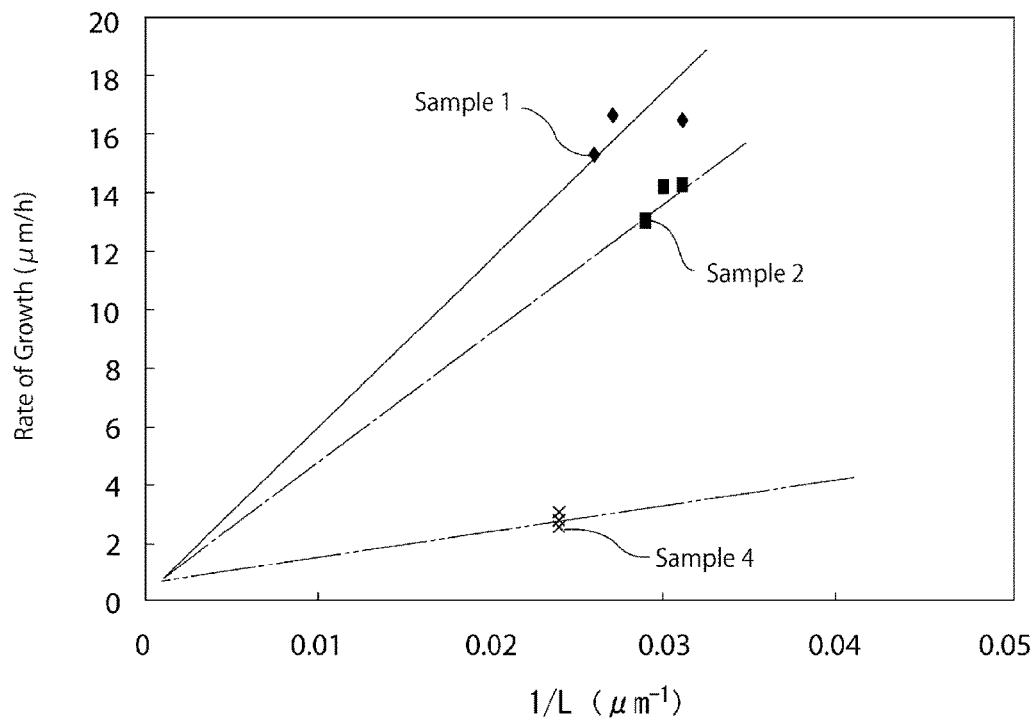
FIG. 14 is a graph showing the rates of growth of monocrystalline silicon carbide epitaxial growth films in Samples 1, 2, and 4.
Figure 15:
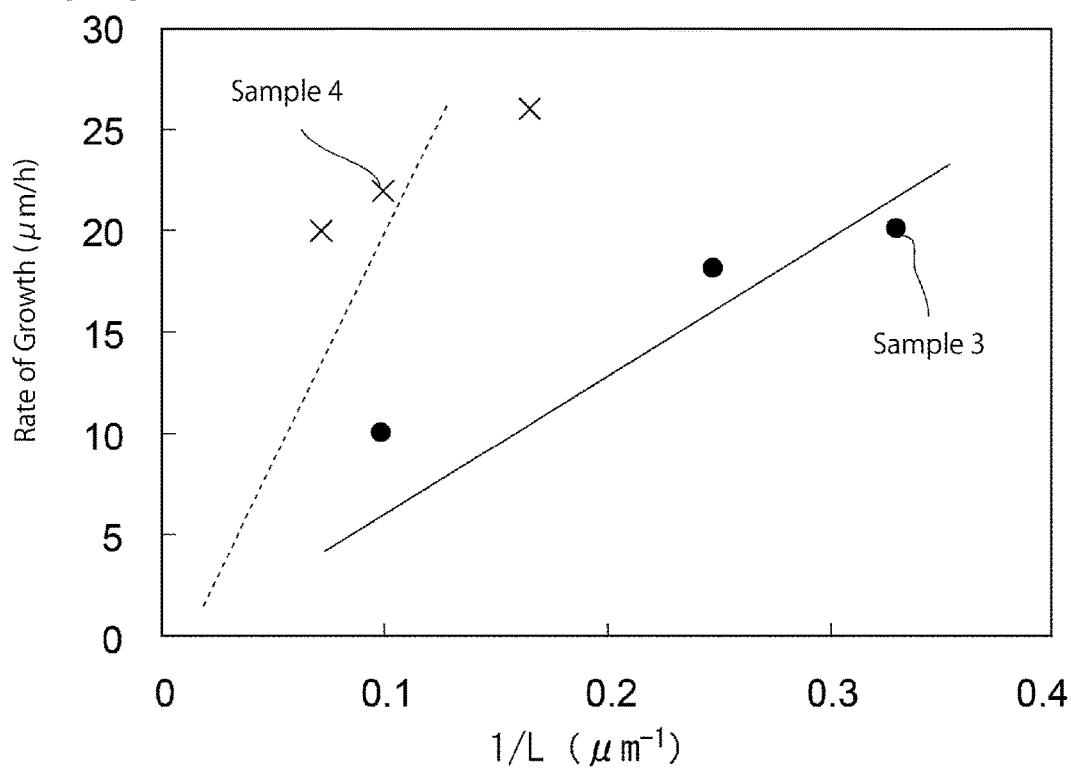
FIG. 15 is a graph showing the rates of growth of monocrystalline silicon carbide epitaxial growth films in Samples 3 and 4.

The results are shown in FIGS. 14 and 15. In FIGS. 14 and 15, the ordinate represents the rate of growth of each monocrystalline silicon carbide epitaxial growth film 20 and the abscissa represents the reciprocal (1/L) of the thickness (L) of the silicon melt layer 13.

As seen from the results shown in FIGS. 14 and 15, in the case of using Samples 1 and 2 in which when the polycrystalline silicon carbide film 11c forming the surface layer of the feed substrate 11 was subjected to X-ray diffraction, not only a diffraction peak corresponding to the (111) crystal plane but also diffraction peaks other than the diffraction peak corresponding to the (111) crystal plane were observed as diffraction peaks corresponding to a crystal polymorph of polycrystalline 3C—SiC, the rate of growth of the monocrystalline silicon carbide epitaxial growth film 20 was high. On the other hand, in the case of using Samples 3 and 4 in which when the polycrystalline silicon carbide film 11c forming the surface layer of the feed substrate 11 was subjected to X-ray diffraction, only diffraction peaks corresponding to the (111) crystal plane were observed as diffraction peaks corresponding to a crystal polymorph of polycrystalline 3C—SiC and, besides the first-order diffraction peak corresponding to the (111) crystal plane, no first-order diffraction peak having an intensity of 10% or more of the intensity of the first-order diffraction peak corresponding to the (111) crystal plane was observed, the rate of growth of the monocrystalline silicon carbide epitaxial growth film 20 was low. This shows that Samples 3 and 4 are less likely to cause the elution into the silicon melt layer 13.

(Measurement Conditions of Rate of Growth of Monocrystalline Silicon Carbide Epitaxial Growth Film 20)

Seed substrate: a silicon carbide substrate with a 4H crystal polymorph,
Pressure of Atmosphere: $10^{-6}$ to $10^{-4}$ Pa, and
Temperature of Atmosphere: 1900° C.

EXAMPLE

Figure 16:
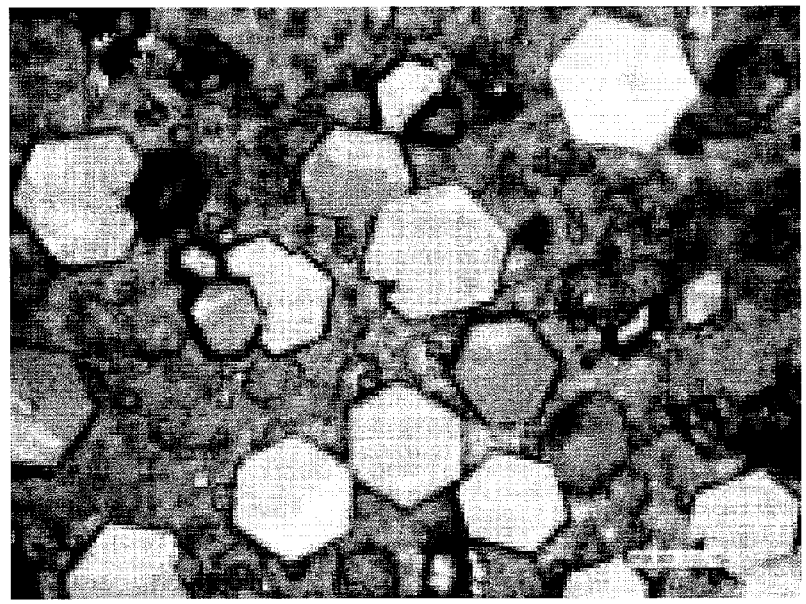
FIG. 16 is a SEM photograph of a seed substrate (Sample 3) after being subjected to an experiment of liquid phase epitaxial growth in an example.

Using the above produced Sample 1 as the feed substrate 11 and the above produced Sample 3 as the seed substrate 12, an experiment of liquid phase epitaxial growth of a monocrystalline silicon carbide was conducted under the same conditions as in the above experiment for evaluation of rate of growth. Thereafter, a photograph of the surface of Sample 3 serving as the seed substrate 12 was taken with a scanning electron microscope (SEM). The SEM photograph of the surface of Sample 3 is shown in FIG. 16. The photograph shown in FIG. 16 reveals that by using as the seed substrate 12 Sample 3 in which upon X-ray diffraction of the polycrystalline silicon carbide film a first-order diffraction peak corresponding to the (111) crystal plane is observed as a first-order diffraction peak corresponding to a crystal polymorph of polycrystalline 3C—SiC but no other first-order diffraction peak having a diffraction intensity of 10% or more of the diffraction intensity of the first-order diffraction peak corresponding to the (111) crystal plane is observed, a hexagonal monocrystalline silicon carbide epitaxial growth film can be obtained.

COMPARATIVE EXAMPLE

Figure 17:
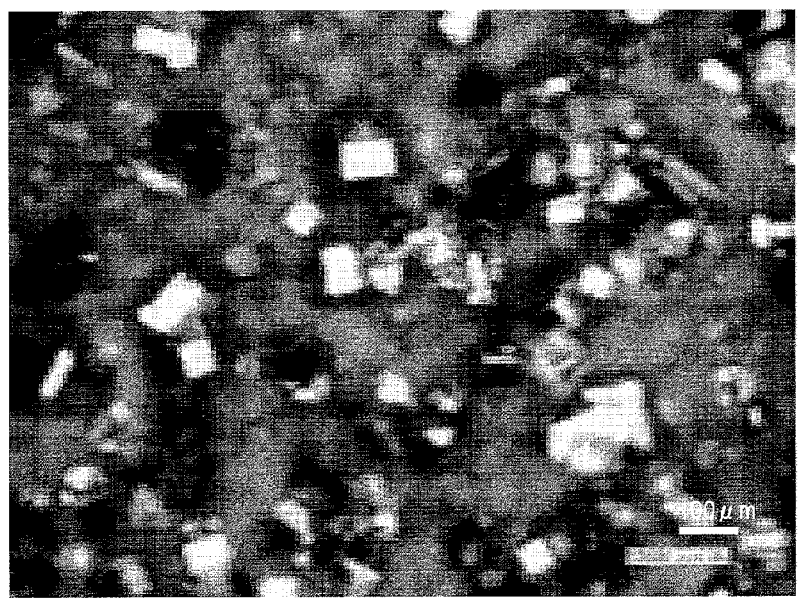
FIG. 17 is a SEM photograph of a seed substrate (Sample 2) after being subjected to an experiment of liquid phase epitaxial growth in a comparative example.

Using the above produced Sample 1 as a feed substrate and the above produced Sample 2 as a seed substrate, an experiment of liquid phase epitaxial growth of a monocrystalline silicon carbide was conducted under the same conditions as in the above experiment for evaluation of rate of growth. Thereafter, a photograph of the surface of Sample 2 serving as the seed substrate was taken with a scanning electron microscope (SEM). The SEM photograph of the surface of Sample 2 is shown in FIG. 17. The photograph shown in FIG. 17 reveals that in the case of using as a seed substrate Sample 2 in which upon X-ray diffraction of a polycrystalline silicon carbide film a first-order diffraction peak corresponding to the (111) crystal plane is observed as a diffraction peak corresponding to a crystal polymorph of polycrystalline 3C—SiC but no other first-order diffraction peak having a diffraction intensity of 10% or more of the diffraction intensity of the first-order diffraction peak corresponding to the (111) crystal plane is observed, epitaxial growth hardly progresses and no suitable hexagonal monocrystalline silicon carbide epitaxial growth film can be obtained.

REFERENCE SIGNS LIST

10 . . . vessel
11 . . . feed substrate
11a . . . principal surface
11b . . . support member
11c . . . polycrystalline silicon carbide film
12 . . . seed substrate
12a . . . principal surface
12b . . . support member
12b . . . polycrystalline silicon carbide film
13 . . . silicon melt layer
20 . . . monocrystalline silicon carbide epitaxial growth film

The invention claimed is:

1. A seed material for liquid phase epitaxial growth of a monocrystalline silicon carbide, the seed material being used in a method for liquid phase epitaxial growth of a monocrystalline silicon carbide and including a surface layer containing a polycrystalline silicon carbide with a 3C crystal polymorph,
wherein upon X-ray diffraction of the surface layer, a first-order diffraction peak corresponding to a (111) crystal plane is observed as a diffraction peak corresponding to the polycrystalline silicon carbide with a 3C crystal polymorph but no other first-order diffraction peak having a diffraction intensity of 10% or more of the diffraction intensity of the first-order diffraction peak corresponding to the (111) crystal plane is observed;
an LO peak derived from a polycrystalline silicon carbide with a 3C crystal polymorph is observed upon Raman spectroscopic analysis of the surface layer with an excitation wavelength of 532 nm and the absolute amount of shift of the LO peak from 972 $cm^{-1}$ is 4 $cm^{-1}$ or more;
the surface layer is substantially made of the polycrystalline silicon carbide with a 3C crystal polymorph; and
a full width at half-maximum of the LO peak is 15 $cm^{-1}$ or less.

2. The seed material for liquid phase epitaxial growth of a monocrystalline silicon carbide according to claim 1, wherein
upon X-ray diffraction of the surface layer at least one first-order diffraction peak is observed, each first-order diffraction peak corresponding to one of a (111) crystal plane, a (200) crystal plane, a (220) crystal plane, and a (311) crystal plane, and
the average crystallite diameter calculated from the at least one first-order diffraction peak is more than 700 Å.

3. The seed material for liquid phase epitaxial growth of a monocrystalline silicon carbide according to claim 1, wherein the proportion of (111) crystal planes having an orientation angle of 67.5° or more in the (111) crystal planes observed by X-ray diffraction of the surface layer is 80% or more.

4. The seed material for liquid phase epitaxial growth of a monocrystalline silicon carbide according to claim 1, wherein the amount of shift of the LO peak from 972 $cm^{-1}$ is 4 $cm^{-1}$ or more.

5. The seed material for liquid phase epitaxial growth of a monocrystalline silicon carbide according to claim 1, the seed material including: a support member; and a polycrystalline silicon carbide film formed on the support member and forming the surface layer.

6. The seed material for liquid phase epitaxial growth of a monocrystalline silicon carbide according to claim 5, wherein the polycrystalline silicon carbide film has a thickness within a range of 30 μm to 800 μm.

7. The seed material for liquid phase epitaxial growth of a monocrystalline silicon carbide according to claim 1, the seed material being formed of a polycrystalline silicon carbide material containing a polycrystalline silicon carbide with a 3C crystal polymorph.

8. A method for liquid phase epitaxial growth of a monocrystalline silicon carbide, wherein the seed material for liquid phase epitaxial growth of a monocrystalline silicon carbide according to claim 1 and a feed material including a surface layer made of silicon carbide are heated with the surface layers of the seed material and the feed material facing each other through a silicon melt layer to epitaxially grow a monocrystalline silicon carbide on the surface layer of the seed material.

* * * * *